United States Patent

Huang et al.

[11] Patent Number: 5,766,780
[45] Date of Patent: Jun. 16, 1998

[54] REVERSED ORDER NIMN EXCHANGE BIASING FOR DUAL MAGNETORESISTIVE HEADS

[75] Inventors: Fujian Huang, Pittsburgh, Pa.; James Giusti, Chanhassen; Gregory S. Mowry, Burnsville, both of Minn.

[73] Assignee: Seagate Technology, Inc., Scotts Valley, Calif.

[21] Appl. No.: 801,127

[22] Filed: Feb. 14, 1997

[51] Int. Cl.$^6$ .................................. G11B 5/66
[52] U.S. Cl. .................. 428/692; 428/611; 428/667; 428/678; 428/694 R; 428/694 TR; 428/694 T; 428/694 TS; 428/694 TM; 428/900; 360/113; 324/252
[58] Field of Search .................... 428/611, 667, 428/678, 694 R, 694 TR, 694 T, 694 TS, 694 TM, 682, 900; 360/113; 324/252

[56] References Cited

U.S. PATENT DOCUMENTS

| | | |
|---|---|---|
| 5,079,831 | 1/1992 | Reid ................................ 29/603.13 |
| 5,084,794 | 1/1992 | Smith .................................... 360/113 |
| 5,103,553 | 4/1992 | Mallary ............................ 29/603.13 |
| 5,193,038 | 3/1993 | Smith .................................... 360/113 |
| 5,296,987 | 3/1994 | Anthony et al. ..................... 360/113 |
| 5,309,304 | 5/1994 | Neberhuis et al. ................. 360/113 |
| 5,309,305 | 5/1994 | Nepela ................................. 360/113 |
| 5,323,285 | 6/1994 | Smith .................................... 360/113 |
| 5,337,203 | 8/1994 | Kitada et al. ........................ 360/113 |
| 5,357,388 | 10/1994 | Smith .................................... 360/113 |
| 5,406,433 | 4/1995 | Smith .................................... 360/113 |
| 5,434,733 | 7/1995 | Hesterman et al. ................. 360/113 |
| 5,442,508 | 8/1995 | Smith .................................... 360/113 |
| 5,508,868 | 4/1996 | Cheng .................................. 360/113 |
| 5,549,978 | 8/1996 | Iwasaki ................................ 428/692 |

OTHER PUBLICATIONS

Adrian J. Devasahayam and Mark H. Kryder, "A Study of the NIFe/NiMn Exchange Couple", *IEEE Transactions on Magnetics*, vol. 32, No. 5, Sep. 1996.

*Primary Examiner*—Leszek Kilman
*Attorney, Agent, or Firm*—Westman, Champlin & Kelly, P.A.

[57] ABSTRACT

The present invention includes a magnetoresistive type sensor having a first sensor layer of NiFe and a first layer of antiferromagnetic material, preferably NiMn. Portions of the first NiFe layer are deposited directly on top of the first layer of antiferromagnetic material such that the portions of the first NiFe sensor layer are in contact with the first layer of antiferromagnetic material. The first layer of antiferromagnetic material exchange couples with the first NiFe sensor layer to thereby provide domain stabilization of the first NiFe sensor layer. The first layer of antiferromagnetic material is deposited directly on top of a first baselayer of molybdenum to enhance the exchange coupling between the first NiFe sensor layer and the first antiferromagnetic layer.

17 Claims, 3 Drawing Sheets

REVERSED ORDER NIMN EXCHANGE BIASING FOR DUAL MAGNETORESISTIVE HEADS

CROSS REFERENCE TO RELATED APPLICATIONS

Co-pending and commonly assigned patent application entitled A METHOD FOR CONTROLLING SENSOR-TO-SENSOR ALIGNMENT AND MATERIAL PROPERTIES IN A DUAL MAGNETORESISTIVE SENSOR, Ser. No. 08/801,126, now U.S. Pat. No. 5,721,008, filed on even date herewith, is herein incorporated by reference.

BACKGROUND OF THE INVENTION

The present application claims the benefit of earlier filed U.S. Provisional application Ser. No. 60/028,972, entitled REVERSED ORDER NIMN EXCHANGE BIASING FOR DUAL MAGNETORESISTIVE HEADS, filed on Oct. 15, 1996.

The present invention relates generally to magnetoresistive (MR) type sensors. More particularly, the present invention relates to dual MR (DMR) heads and other types of MR heads using nickel-manganese (NiMn) as an exchange bias layer.

Because NiMn exhibits good exchange coupling with nickel-iron (NiFe) sensors when deposited directly on top of the NiFe sensor layer, NiMn has been suggested for use as a magnetic domain stabilization material for MR type heads. However, some applications such as spin valve and DMR heads may require film structures with a reversed order. In other words, they may require that at least one NiFe sensor layer be deposited on top of a NiMn antiferromagnetic exchange bias layer, instead of versa. Such reversed order structures can exhibit very different exchange coupling, as compared to structures only having NiMn exchange bias layers deposited on top of the NiFe sensor layers, depending upon film thickness, annealing procedure, and the material positioned directly under the NiMn layer. See A. J. Devasahayam and M. H. Kryder, IEEE Trans. Magn. 32, 4654 (1996) and T. Lin, G. L. Gorman, and C. Tsang, IEEE Trans. Magn. 32, 3443 (1996).

For example, the reversed order structure has been shown to exhibit exchange fields higher than the coercivity, which is undesirable for MR head applications. See A. J. Devasahayam and M. H. Kryder, IEEE Trans. Magn. 32, 4654 (1996). This problem can be solved by using a proper underlayer. Therefore, in order to achieve sufficient exchange field strength while maintaining low coercivity when the NiFe sensor layer is deposited on top of the NiMn layer, a proper underlayer or seedlayer is required to ensure the desired properties and crystal orientation in the NiMn layer.

Devasahayam et al. disclose that a NiFe sensor layer deposited directly on top of a NiMn antiferromagnetic layer can be sufficiently exchanged biased if the NiMn layer is itself deposited upon an additional thin underlayer of NiFe. They also suggest that underlayers of Zr and Ni may facilitate the exchange coupling as well. Without this thin underlayer, the exchange field produced between the NiMn layer and the NiFe sensor layer is less than the coercivity of the NiFe sensor layer. However, this solution has numerous disadvantages. Although adding a NiFe underlayer can increase the exchange bias field strength between the NiMn layer and the NiFe sensor layer, adding non-sensor NiFe layers to the device can contribute to noise generation. Further, the addition of extra NiFe or other layers, used as an underlayer for the NiMn, increases the total number of layers required and thus increases the complexity of the fabrication process. Consequently, an MR type sensor or head which overcomes these problems would be a significant improvement in the art.

SUMMARY OF THE INVENTION

The present invention presents a reversed order NiMn exchange biasing scheme for various MR heads such as spin valve heads and dual stripe heads. It places the MR sensor layer on top of the NiMn exchange layer, and uses Mo as a seedlayer under the NiMn to enhance the exchange coupling between the MR sensor and the antiferromagnetic NiMn layer. This is particularly useful for simplified dual stripe MR head processes which use Mo as a conductor material, so that Mo serves the dual purposes of conductor and seedlayer in the DMR head structure.

The present invention includes a magnetoresistive type sensor having a first magnetoresistive sensor layer of NiFe and a first layer of antiferromagnetic material, preferably NiMn. Portions of the first layer of NiFe are deposited directly on top of the first layer of antiferromagnetic material such that the portions of the first layer of NiFe are in contact with the first layer of antiferromagnetic material. The first layer of antiferromagnetic material exchange couples with the first layer of NiFe to thereby provide domain stabilization of the first layer of NiFe. The first layer of antiferromagnetic material is deposited directly on top of a first underlayer of molybdenum to enhance the exchange coupling between the first layer of NiFe and the first antiferromagnetic layer.

In some preferred embodiments of the present invention, the magnetoresistive type sensor is a DMR sensor in which the first layer of NiFe is one of two magnetoresistive sensor layers. Also in some preferred embodiments, the molybdenum layer functions as both a conductor layer for connecting the first NiFe sensor layer to external circuitry and as a seedlayer for enhancing the exchange coupling between the NiMn and the NiFe. Thus, no additional seedlayer is required for enhancing the exchange coupling between the first NiFe sensor layer and the first antiferromagnetic layer.

DETAILED DESCRIPTION OF THE PREFERRED EMBODIMENTS

The present invention is based in part upon the recognition that molybdenum (Mo), when used as an underlayer (i.e., as a baselayer or seedlayer) for a nickel-magenese (NiMn) antiferromagnetic layer, helps to establish a desired crystal structure in the NiMn layer. The Mo underlayer increases the effectiveness of the NiMn as an exchange bias layer for stabilizing a nickel-iron (NiFe) sensor layer deposited on top of the NiMn layer. This in turn helps to improve the domain stabilization of the NiFe sensor layer, and allows the NiFe sensor layer to be placed on top of the NiMn exchange bias layer. This recognition is very beneficial in dual magnetoresistive (DMR) or spin valve type MR Heads in which it is convenient or necessary to deposit one or more NiFe sensor layers on top of the corresponding NiMn exchange bias layers.

The present invention is also based partially upon the recognition that, since Mo is a good conductor material for connecting the sensor layer to external circuitry, the conductor layer can double as the underlayer for the NiMn exchange bias layer. Thus, not only can the NiFe sensor layer be deposited on top of the NiMn exchange bias layer, but also the need for a separate underlayer is eliminated. This simplifies the complexity of the manufacturing process, and reduces the fabrication costs.

Figure 1:
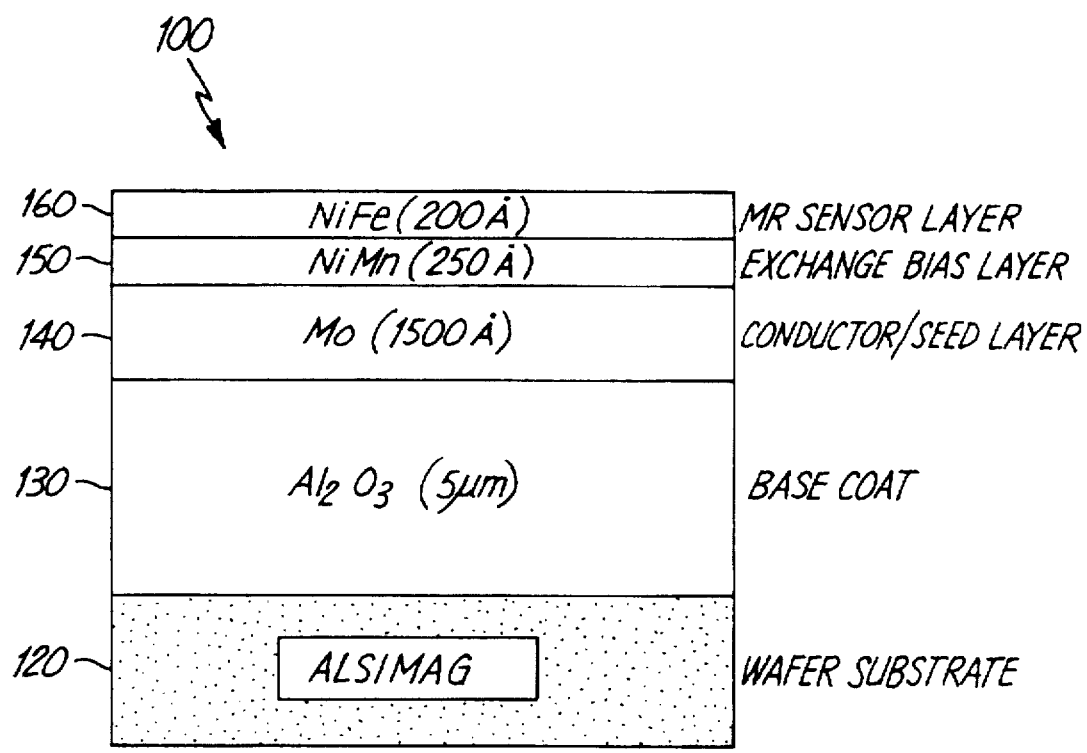
FIG. 1 is a diagrammatic view of a film stack representing portions of a magnetoresistive type sensor having a NiFe sensor layer deposited on top of a NiMn exchange bias layer, and using a molybdenum conductor layer as an underlayer for the NiMn layer.

FIG. 1 illustrates film stack 100 which is representative of portions of an MR sensor. For instance, stack 100 is representative of one possible MR sensor configuration as viewed in a wing region of the MR sensor adjacent to the active region. Stack 100 was fabricated for use in testing of the present invention. Stack 100 includes wafer substrate 120, base coat 130, conductor layer 140, antiferromagnetic exchange bias layer 150, and MR sensor layer 160. During testing, a 4.5-inch Alsimag wafer was used as wafer substrate 120. A 5 μm thick layer of $Al_2O_3$ was deposited on wafer substrate 120 and used as base coat 130. Together, wafer substrate 120 and base coat 130 were used as a substrate for the remainder of the film stack. On top of base coat 130, a 1,500 Å thick layer of Mo was deposited to provide a conductor/underlayer. On top of conductor/underlayer 140, a 250 Å thick layer of NiMn was deposited as an antiferromagnetic exchange layer. On top of exchange layer 150, a 200 Å thick NiFe sensor layer 160 was deposited. Deposition of layers 140, 150 and 160 occurred in a CVC sputtering cluster tool. Film stack 100 was then annealed at 260° C. for 5 hours in a 2 torr $N_2$ environment.

Figure 2:
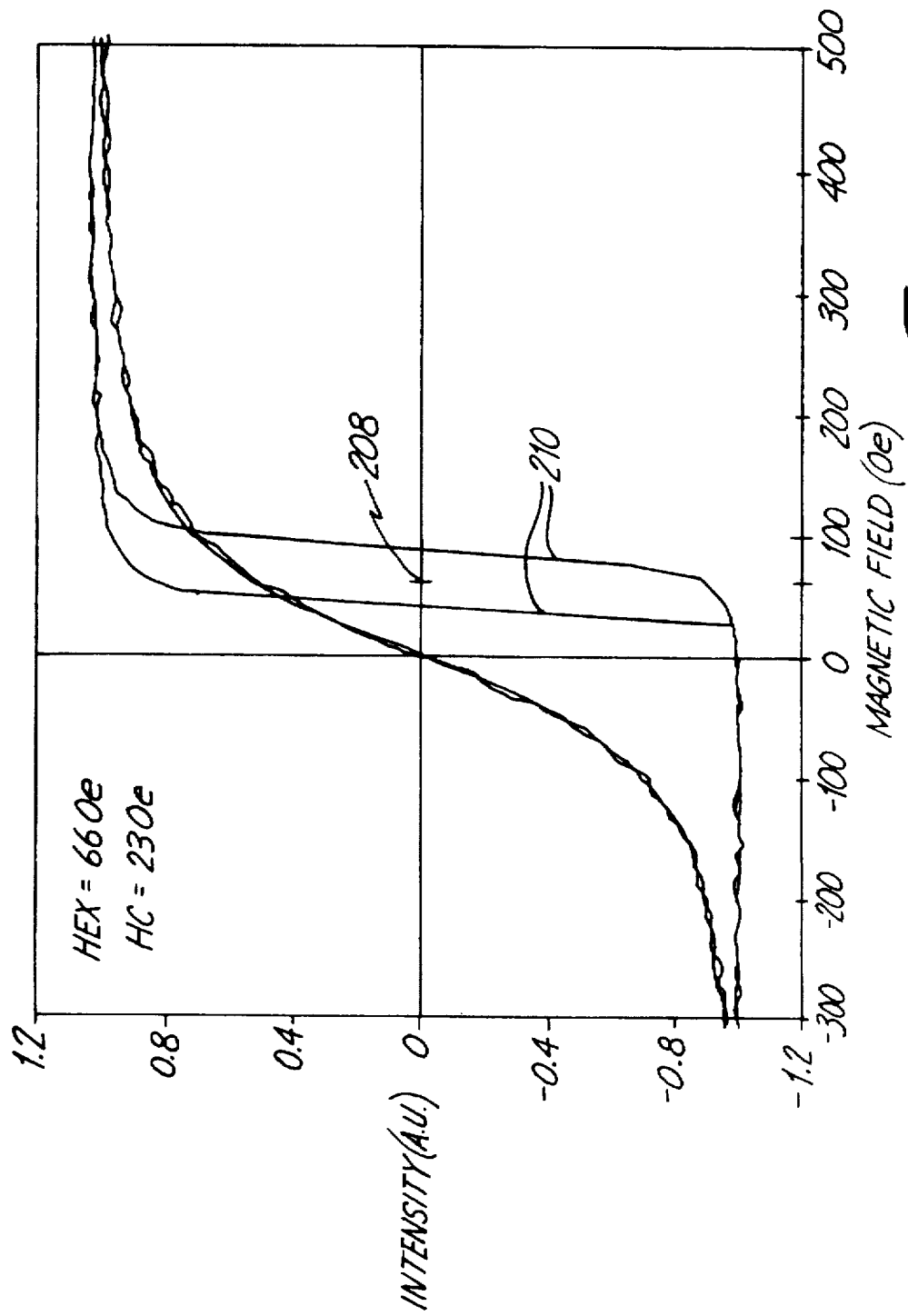
FIG. 2 is plot illustrating M-H loops of the film stack illustrated in FIG. 1 as measured by a magneto-optic Kerr magnetometer.

FIG. 2 illustrates M-H loops for film stack 100 as measured by a magneto-optic Kerr magnetometer. As can be seen from midpoint 208 of easy axis loop 210, the exchange field between layer 150 of NiMn and layer 160 of NiFe was 66 Oe after only one annealing cycle. It is believed that the exchange field strength will increase with longer annealing times or additional cycles. The 66 Oe exchange field is comparable with the exchange fields obtained in the prior art when the NiMn layer is deposited directly on top of the NiFe sensor layer. When the NiMn antiferromagnetic layer is deposited directly on top of the NiFe sensor layer as is common in the industry, an exchange field having a strength of between 50 and 70 Oe is typically obtained after a similar annealing. The exchange field $H_{ex}$ will depend inversely upon sensor thickness (i.e., $H_{ex} \sim 1/t_{mr}$). In contrast, without the benefit of the present invention, when NiFe sensor layers have previously been deposited directly on top of the NiMn exchange bias layer without a proper underlayer, exchange fields can be considerably lower than coercivity under similar annealing conditions.

The high exchange bias field and low coercivity achieved using a Mo underlayer, in accordance with preferred embodiments of the present invention, ensures proper MR sensor layer stabilization of DMR structures in which at least one of the sensor layers is preferably deposited on top of the antiferromagnetic exchange bias layer. MR sensors in accordance with the present invention include a first MR sensor layer deposited on top of a first antiferromagnetic exchange bias layer. Preferably, the sensor layer is NiFe and the exchange layer is NiMn. The antiferromagnetic exchange layer is deposited directly on top of the Mo conductor layer. In combination with a single step sensor1/spacer/sensor2 process, this significantly simplifies the MR or DMR head fabrication process by eliminating the need for an extra seedlayer or underlayer, while still improving the sensor performance.

While layers of other materials can be used as underlayers to enhance the exchange coupling provided by the NiMn antiferromagnetic layer, they may lead to smaller exchange fields than the coercivity of the NiFe sensor, which is undesirable for MR head applications. A thin NiFe film has been found to function as a an adequate underlayer for the NiMn, but inclusion of additional non-sensor NiFe layers can be a source of noise generation in the sensor. Since Mo can be used as the conductor in DMR or other types of MR heads, no extra underlayer is needed to achieve good exchange coupling. Reducing the number of layers is desirable for reducing process variations and improving head stability. In addition, it is important to match the two sensor structures as much as possible to achieve good read performance in a DMR. An extra seedlayer for the first sensor would ruin such symmetry.

Figure 3:
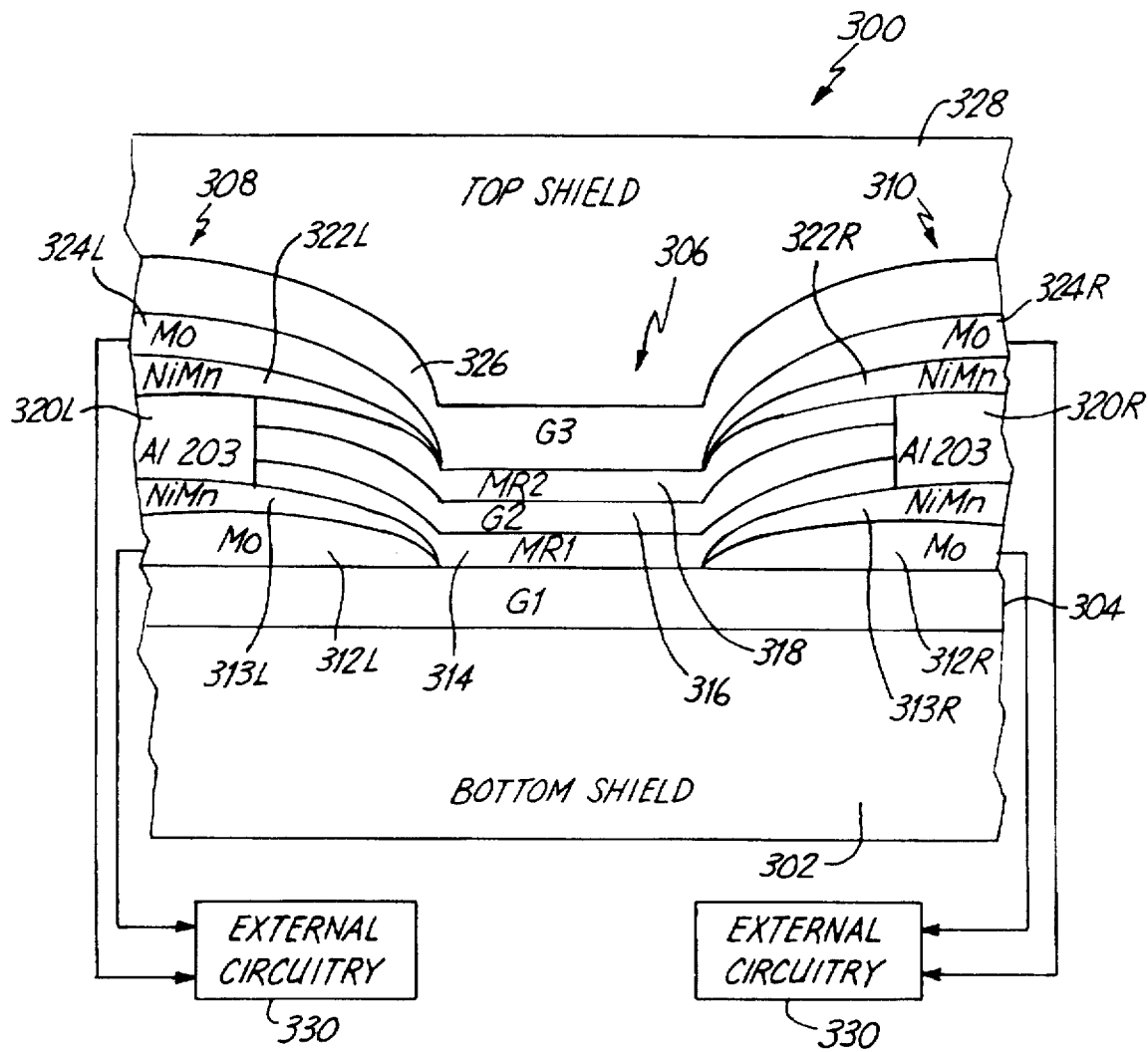
FIG. 3 is a diagrammatic view of a dual magnetoresistive sensor utilizing a reversed order NiMn exchange layer in accordance with preferred embodiments of the present invention.

FIG. 3 is a diagrammatic view of DMR sensor or head 300 in accordance with some preferred embodiments of the present invention. DMR sensor 300 includes bottom shield 302, first gap layer 304, first conductor layer 312 (divided into left and right regions 312L and 312R), first NiMn exchange bias layer 313 (divided into regions 313L and 313R), first NiFe MR sensor layer 314, second gap layer 316, second NiFe MR sensor layer 318, first electrically insulating layer 320 (divided into regions 320L and 320R), second NiMn exchange bias layer 322 (divided into regions 322L and 322R), second conductor layer 324 (divided into regions 324L and 324R), third gap layer 326 and top shield 328.

In fabricating DMR sensor 300 in accordance with preferred embodiments of the present invention, first insulating gap layer 304 is deposited onto bottom shield layer 302. Bottom shield 302 can be any of a variety of well known shield materials such as Sendust™ Gap layer 304, which is also known as the sensor-to-shield gap or the first read gap, can be formed from a wide variety of well known gap materials. In some preferred embodiments, gap layer 304 is formed from aluminum oxide ($Al_2O_3$). Preferably, layer 302 will have a thickness of between about 2–3 μm, while layer 304 will have a thickness of about 900 to 1000 Å.

Next, Mc conductor layer 312 and NiMn antiferromagnetic exchange layer 313 are deposited and patterned, with a photomasking and lift-off process, on gap layer 304 in wing regions 308 and 310 of sensor 300. Between regions 308 and 310, central region 306 is defined which will eventually correspond to the active sensor region. Conductor layer 312 eventually provides a low resistance contact from the first sensor layer 314 to external electronic circuitry. Antiferromagnetic exchange layer 313 is for the suppression of magnetic domains in the first sensor layer 314 in order to minimize unwanted Barkhausen noise. The distance between the left and right conductor/exchange layers 312L/313L and 312R/313R defines width $W_a$ of central or active region 306 for the first sensor. Preferably, layer 312 will have a thickness of between about 500 Å and about 1500 Å. Layer 313 will preferably have a thickness of between about 200 Å and about 300 Å.

Next, first NiFe sensor layer 314, insulating spacer layer 316, and second NiFe sensor layer 318 are preferably deposited in the same vacuum deposition run, without breaking vacuum. This prevents run-to-run mismatches between sensor layers 314 and 318. In depositing this tri-layer, first MR sensor layer 314 is deposited such that it covers layer 304 of gap material in central region 306, and such that it covers portions of antiferromagnetic exchange layer 313 in left and right regions 308 and 310, respectively. Next, layer 316 of electrically insulating gap or spacer material is deposited on top of NiFe sensor layer 314. Then, NiFe sensor layer 318 is deposited on top of layer 316 of spacer material.

Spacer layer 316 is used to electrically isolate sensor layers 314 and 318. Also, the thickness of spacer layer 316 can be controlled to establish a desired distance between sensor layers 314 and 318 in order to bias the two sensors. As stated above, in preferred embodiments, layers 314 and 318 of MR material are both made from NiFe. However, other MR materials can be used, particularly for sensor layer 318. Spacer layer 316 is preferably made from $SiO_2$. Other insulating materials can be used for spacer layer 316, but any such alternate material should be removable using ion mill reactive etching (dry etch). Therefore, $Al_2O_3$ would not be preferred since it is typically removed with a chemical wet etch process to achieve a clean removal. In preferred embodiments, layers 314 and 318 each have a thickness of between about 100 Å and 300 Å. Layer 316 preferably has a thickness of between about 100 Å and about 1000 Å.

After deposition of first and second sensor layers 314 and 318 and insulating spacer layer 316, the tri-layer is patterned to the desired geometry by a single photomasking and ion milling process. By patterning both sensor layers simultaneously, geometrical misalignment is avoided. Then, prior to lift-off of the photoresist, layer 320 of electrically insulating material is deposited. After lift-off of the photoresist, layer 320 of electrically insulating material remains only in outer portions of regions 308 and 310, adjacent to the tri-layer. While layer 320 is illustrated in FIG. 3 to be $Al_2O_3$, other electrically insulating materials can be used as well.

After completing the depositions of the sensor1/spacer/sensor2 tri-layer and of insulating layer 320, antiferromagnetic exchange bias layer 322 and conductor layer 324 are deposited and patterned, with a photomasking and lift-off process, in regions 308 and 310 of sensor 300. Layers 322 and 324 provide functions equivalent to those provided by layers 313 and 312. Layer 322 of antiferromagnetic material stabilizes the magnetic domains in layer 318 of magnetoresistive material. Conductor layer 324 provides a low resistance contact from sensor layer 318 to external circuitry 330. As is the case with layers 313 and 312, layers 322 and 324 are preferably NiMn and Mo, respectively. However, other known materials can be used as well. Preferably, layers 322 and 324 will have thicknesses which are about the same as the thicknesses of layers 312 and 313, respectively. Note that the sequence of deposition of conductor 324 and exchange layer 322 is reversed in order from that used to deposit layers 312 and 313.

Layer 326 of insulating gap material is deposited on top of conductor layer 324 in the regions 308 and 310 of DMR sensor 300, and on top of layer 318 in active region 306. Preferably, layer 326 is $Al_2O_3$ having a thickness of about 900 Å. Finally, top shield 328 of soft magnetic material is plated on top of insulating gap layer 326. In preferred embodiments, top shield 328 is Sendust™ or NiFe having a thickness of about 3.0–3.5 μm.

The reverse order of deposition of antiferromagnetic layer 322 and conductor layer 324, in comparison with the order of deposition of layers 312 and 313, is preferred because the antiferromagnetic layer must be in contact with the magnetoresistive sensor layer for effective suppression of magnetic domains to be achieved. The effectiveness of the exchange layer in suppressing magnetic domains in the sensor layer is also dependent upon the sequence of deposition of the exchange layer and sensor. The sequence of the antiferromagnetic material layer deposited on top of the sensor layer, as is the case with layers 318 and 322, has been shown to produce sufficient suppression of magnetic domains in the sensor layer. However, as discussed above, the reverse order of deposition used with magnetoresistive sensor layer 314 and antiferromagnetic layer 313 requires a proper underlayer material to establish the desired properties in the antiferromagnetic material. The Mo used in conductor layer 312 has been found to be a beneficial underlayer material for this purpose. Thus, in preferred embodiments, layer 312 of Mo serves both as a conductor layer for coupling sensor layer 314 to external electronic circuitry 330, and as an underlayer used to achieve sufficient antiferromagnetic exchange coupling between antiferromagnetic layer 313 and NiFe sensor layer 314. However, if desired, a Mo underlayer and a separate conductor layer can be used with NiMn layer 312 and sensor layer 314. Since sensor layer 314 can be deposited on top of NiMn layer 313, sensor layers 314 and 318 can be deposited in one run and patterned simultaneously. Thus, material and geometrical mismatches between the sensor layers are avoided.

Although the present invention has been described with reference to preferred embodiments, workers skilled in the art will recognize that changes may be made in form and detail without departing from the spirit and scope of the invention.

What is claimed is:

1. A magnetoresistive sensor comprising:
    a first NiFe sensor layer;
    a first layer of antiferromagnetic material, wherein portions of the first NiFe sensor layer are deposited directly on top of the first layer of antiferromagnetic material such that the portions of the first NiFe sensor layer are in contact with the first layer of antiferromagnetic material, and wherein the first NiFe sensor layer exchange couples with the first layer of antiferromagnetic material to thereby provide domain stabilization of the first NiFe sensor layer; and
    a first baselayer of molybdenum, wherein the first layer of antiferromagnetic material is deposited directly on top of the first baselayer of molybdenum.

2. The magnetoresistive sensor of claim 1, wherein the first baselayer of molybdenum increases the domain stabilization of the first NiFe sensor layer by the first layer of antiferromagnetic material.

3. The magnetoresistive sensor of claim 2, wherein a first exchange field is produced between adjoining surfaces of the portions of the first NiFe sensor layer and the first layer of antiferromagnetic material, wherein the first baselayer of molybdenum maintains the exchange field above the coercivity of the first NiFe sensor layer.

4. The magnetoresistive sensor of claim 2, wherein the first layer of antiferromagnetic material comprises a layer of an alloy including Mn.

5. The magnetoresistive sensor of claim 4, wherein the first layer of antiferromagnetic material comprises a layer of NiMn.

6. The magnetoresistive sensor of claim 2, wherein the first baselayer of molybdenum additionally serves as a conductor layer for electrically coupling the first NiFe sensor layer of magnetoresistive material to external circuitry.

7. A dual magnetoresistive (DMR) sensor comprising:

a first molybdenum (Mo) conductor layer positioned in wing regions of the DMR sensor adjacent an active region of the DMR sensor;

a first antiferromagnetic exchange layer positioned in the wing regions of the DMR sensor adjacent the active region of the DMR sensor, wherein the first antiferromagnetic exchange layer is deposited directly on top of the first Mo conductor layer in the wing regions of the DMR sensor; and a first magnetoresistive (MR) sensor layer positioned in the active region of the DMR sensor and at least partially in the wing regions of the DMR sensor adjacent the active region, wherein the first MR sensor layer is deposited directly on top of the first antiferromagnetic exchange layer in the wing regions of the DMR sensor, wherein the first MR sensor layer is exchange coupled by the first antiferromagnetic exchange layer to thereby stabilize magnetic domains of the first MR sensor layer, and wherein the first Mo conductor layer couples the first MR sensor layer to external circuitry.

8. The DMR sensor of claim 7, wherein the first antiferromagnetic exchange layer comprises a layer of nickel-manganese (NiMn).

9. The DMR sensor of claim 8, wherein the first MR sensor layer comprises a layer of nickel-iron (NiFe).

10. The DMR sensor of claim 9, wherein the first Mo conductor layer also functions as a seedlayer for the first antiferromagnetic exchange layer in order to establish a desired crystal orientation in the layer of NiMn.

11. The DMR sensor of claim 9, wherein a first exchange field is produced between adjoining surfaces of the first antiferromagnetic exchange layer and the first MR sensor layer, wherein the first Mo conductor layer also functions as an underlayer for the first antiferromagnetic exchange layer to maintain the first exchange field above the coercivity of the first MR sensor layer.

12. The DMR sensor of claim 7, and further comprising:

a first electrically insulating spacer layer positioned in the active region of the DMR sensor and at least partially in the wing regions of the DMR sensor adjacent the active region, wherein the first electrically insulating spacer layer is deposited on top of the first MR sensor layer;

a second MR sensor layer positioned in the active region of the DMR sensor and at least partially in the wing regions of the DMR sensor adjacent to the active region, wherein the second MR sensor layer is deposited on top of the first electrically insulating spacer layer such that the first electrically insulating spacer layer electrically insulates the first MR sensor layer from the second MR sensor layer;

a second antiferromagnetic exchange layer positioned in the wing regions of the DMR sensor adjacent the active region of the DMR sensor, wherein the second antiferromagnetic exchange layer is deposited directly on top of the second MR sensor layer in at least portions of the wing regions of the DMR sensor; and a second conductor layer positioned in wing regions of the DMR sensor adjacent an active region of the DMR sensor, wherein the second conductor layer couples the second MR sensor layer to external circuitry.

13. The DMR sensor of claim 9, wherein the second antiferromagnetic exchange layer comprises a layer of NiMn, and wherein the second MR sensor layer comprises a layer of NiFe.

14. A dual magnetoresistive (DMR) sensor comprising:

a first layer of molybdenum (Mo);

a first nickel-manganese (NiMn) layer deposited directly on top of the first layer of Mo; and a first nickel-iron (NiFe) sensor layer, wherein the first NiFe sensor layer is deposited directly on top of the first NiMn layer in first and second regions of the DMR sensor adjacent to an active region of the DMR sensor.

15. The DMR sensor of claim 14, wherein the first NiMn layer exchange couples with the first NiFe sensor layer to thereby provide domain stabilization of the first NiFe sensor layer, and wherein the first layer of Mo functions as a seedlayer for the first NiMn layer to thereby increase the effectiveness of the first NiMn layer in providing domain stabilization of the first NiFe sensor layer.

16. The DMR sensor of claim 15, wherein the first layer of Mo also functions as a conductor layer for coupling the first NiFe sensor layer to external circuitry.

17. The DMR sensor of claims 15, and further comprising:

an electrically insulating gap layer deposited directly on top of the first NiFe sensor layer;

a second NiFe sensor layer deposited directly on top of the electrically insulating gap layer;

a second NiMn layer deposited directly on top of the second NiFe sensor layer in the first and second regions of the DMR sensor adjacent to the active region of the DMR sensor; and a second layer of Mo deposited at least partially on top of the second NiMn layer in the first and second regions of the DMR sensor, wherein the second layer of Mo functions as a conductor layer for coupling the second NiFe sensor layer to external circuitry.

* * * * *

UNITED STATES PATENT AND TRADEMARK OFFICE
CERTIFICATE OF CORRECTION

PATENT NO.    : 5,766,780
DATED         : June 16, 1998
INVENTOR(S)   : Huang et al.

It is certified that error appears in the above-identified patent and that said Letters Patent is hereby corrected as shown below:

<u>Title page,</u>
Should list provisional application data as follows:

-- Related U.S. Application Data
[60] Provisional application No. 60/028,972, filed on Oct. 15, 1996 --

Signed and Sealed this

Twenty-third Day of September, 2003

JAMES E. ROGAN
*Director of the United States Patent and Trademark Office*